(12) United States Patent
Nishii et al.

(10) Patent No.: US 6,593,193 B2
(45) Date of Patent: Jul. 15, 2003

(54) SEMICONDUCTOR DEVICE AND METHOD FOR FABRICATING THE SAME

(75) Inventors: Katsunori Nishii, Hirakata (JP); Kaoru Inoue, Otsu (JP); Toshinobu Matsuno, Kyotanabe (JP); Yoshito Ikeda, Ibaraki (JP); Hiroyuki Masato, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/054,843

(22) Filed: Jan. 25, 2002

(65) Prior Publication Data

US 2002/0119610 A1 Aug. 29, 2002

(30) Foreign Application Priority Data

Feb. 27, 2001 (JP) ........................................ 2001-051576

(51) Int. Cl.[7] ............................................. H01L 21/336
(52) U.S. Cl. ........................ 438/285; 438/287; 438/767
(58) Field of Search ................................. 438/104, 591, 438/167, 197, 183, 184, 143, 172, 180, 181, 182, 585, 285, 168, 169, 170, 171, 173, 174, 175, 176, 177, 178, 179, 287, 767; 257/287

(56) References Cited

U.S. PATENT DOCUMENTS 6,140,169 A * 10/2000 Kawai et al. ............... 438/197
6,190,508 B1 * 2/2001 Peng et al. ............. 204/157.46
6,391,727 B1 * 5/2002 Park ............................ 438/287
6,531,718 B2 * 5/2002 Inoue et al. ................. 257/189
6,492,669 B2 * 12/2002 Nakayama et al. .......... 257/282
6,528,370 B2 * 3/2003 Suzuki et al. ............... 438/257
2001/0023964 A1 * 9/2001 Wu et al.

FOREIGN PATENT DOCUMENTS

| JP | 11-501463 | | 2/1999 |
| JP | 11-163334 | | 6/1999 |
| JP | 2000-068498 | * | 3/2000 |
| JP | 2000-164926 | * | 6/2000 |
| WO | WO 97/24752 | | 7/1997 |
| WO | WO 97/24752 | | 10/1997 |

OTHER PUBLICATIONS

Novel GaN–based MOS HEFTs with thermally oxidize gate insulator, Inoue et al.; Electron Devices Meeting, 2001. IEDM Technical Digest. International; Dec. 12, 2001—Dec. 15, 2001; Washington DC, USA; pp. 25.2.1–25.2.4.*

* cited by examiner

Primary Examiner—Olik Chaudhuri
Assistant Examiner—Fernando Toledo
(74) Attorney, Agent, or Firm—Nixon Peabody LLP; Donald R. Studebaker

(57) ABSTRACT

An insulating-gate semiconductor device has a first nitride semiconductor layer formed over a substrate and an insulating oxidation layer obtained by oxidizing a second nitride semiconductor layer formed on the first nitride semiconductor layer. A gate electrode is formed on the insulating oxidation layer.

18 Claims, 19 Drawing Sheets

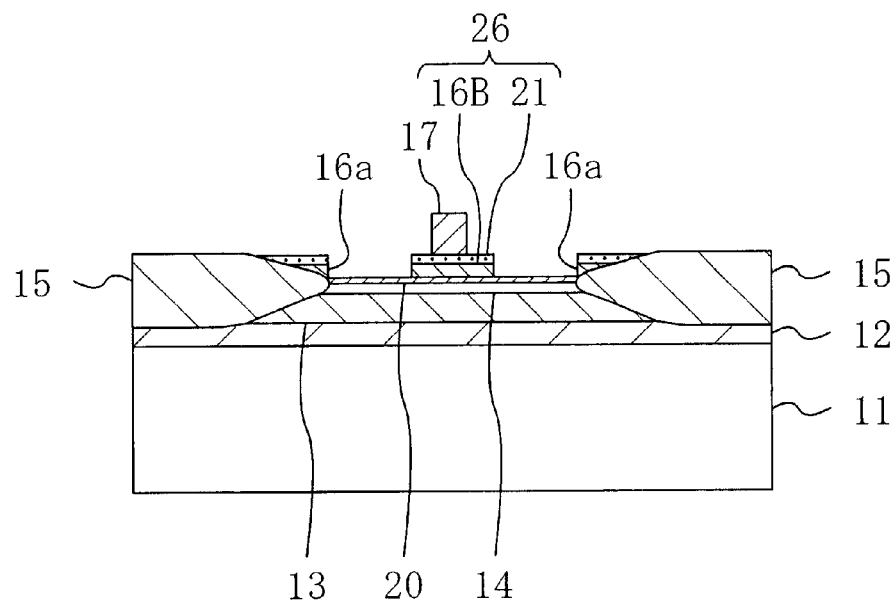
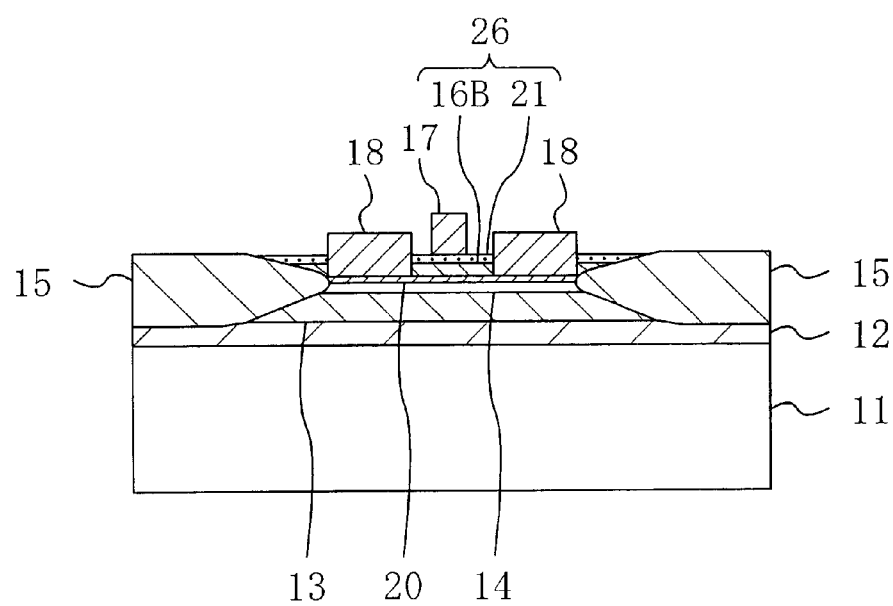

SEMICONDUCTOR DEVICE AND METHOD FOR FABRICATING THE SAME

BACKGROUND OF THE INVENTION

The present invention relates to a semiconductor device having an insulating gate using a nitride semiconductor for an active layer thereof and to a method for fabricating the same.

FIG. 19 shows a cross-sectional structure of a conventional Schottky-gate field effect transistor (FET) which is composed of Group III–V nitride semiconductors.

As shown in FIG. 19, a channel layer 102 composed of gallium nitride (GaN) and a carrier supply layer 103 composed of n-type aluminum gallium nitride (AlGaN) are formed successively on a substrate 101 composed of sapphire. A two-dimensional electron gas layer composed of a potential well and having an extremely high electron mobility is formed adjacent the heterojunction between the upper portion of the channel layer 102 and the carrier supply layer 103. For this reason, the FET is also termed a high electron mobility transistor (HEMT).

In the foregoing conventional Schottky-gate FET, however, the breakdown voltage of the gate electrode is determined by the Schottky characteristic thereof so that the reverse breakdown voltage of the gate electrode is limited. In addition, a forward voltage applied to the gate electrode is also limited to about only 2 V so that a high-output semiconductor device (power device) having a high current driving ability is not obtainable.

SUMMARY OF THE INVENTION

It is therefore an object of the present invention to enhance the current driving ability of a semiconductor device having a gate electrode and composed of nitride semiconductors by solving the foregoing conventional problems.

To attain the object, the present invention uses an insulating gate as a gate electrode in the semiconductor device composed of nitride semiconductors and forms a gate insulating film by oxidizing a deposited nitride semiconductor.

Specifically, a semiconductor device according to the present invention comprises: a first nitride semiconductor layer formed over a substrate; an insulating oxidation layer obtained by oxidizing a second nitride semiconductor layer formed on the first nitride semiconductor layer; and a gate electrode formed on the insulating oxidation layer.

In the semiconductor device according to the present invention, the insulating oxidation layer has an excellent film quality and an extremely clean interface in contact with the underlying first nitride semiconductor layer. As a result, a leakage current seldom flows in the gate electrode formed on the insulating oxidation layer and the current-voltage characteristic of the semiconductor device is not limited by the Schottky characteristic of the gate electrode so that a high breakdown voltage and a high current driving ability are achievable.

In the semiconductor device according to the present invention, an oxidation rate for the first nitride semiconductor layer is preferably lower than an oxidation rate for the second nitride semiconductor layer. The arrangement facilitates selective oxidation of only the second nitride semiconductor layer during the fabrication process.

In the semiconductor device according to the present invention, each of the first and second nitride semiconductor layers is preferably composed of the same material.

In the semiconductor device according to the present invention, the first nitride semiconductor layer preferably contains aluminum. Aluminum gallium nitride (AlGaN) obtained by thus doping gallium nitride, which is a typical nitride semiconductor material, with aluminum is resistant to oxidation during the formation of the insulating oxidation layer because of its oxidation rate lower than that of gallium nitride. In addition, aluminum gallium nitride forms a potential barrier layer because of its energy gap larger than that of gallium nitride.

Preferably, the semiconductor device according to the present invention further comprises an active layer formed between the substrate and the first nitride semiconductor layer and composed of a third nitride semiconductor having an energy gap smaller than in the first nitride semiconductor layer. This surely implements a high electron mobility transistor (HEMT) having a high breakdown voltage and a high current driving ability in which the first nitride semiconductor layer serves as the carrier supply layer and the third nitride semiconductor layer serves as a channel layer.

Preferably, the semiconductor device according to the present invention further comprises an anti-oxidation layer formed between the first nitride semiconductor layer and the insulating oxidation layer and composed of a fourth nitride semiconductor having an oxidation rate lower than an oxidation rate for the second nitride semiconductor layer. In forming the insulating oxidation layer by oxidizing the second nitride semiconductor layer in the arrangement, the oxidation is substantially halted by the fourth nitride semiconductor layer so that the film thickness of the insulating oxidation layer serving as a gate insulating film is controlled easily.

In this case, the anti-oxidation layer is preferably composed of aluminum nitride.

Preferably, the semiconductor device according to the present invention further comprises an insulating film formed between the insulating oxidation layer and the gate electrode. The arrangement positively suppresses a leakage current flowing in the gate electrode, allows a high voltage to be applied to the gate electrode, and thereby further enhances the current driving ability of the semiconductor device.

In this case, the insulating film is preferably composed of a silicon oxide film or a silicon nitride film. The arrangement provides a high insulating property since the insulating film has an extremely dense film texture.

Preferably, the semiconductor device according to the present invention further comprises: source and drain electrodes formed in regions of the first nitride semiconductor layer which are located on both sides of the gate electrode, wherein the insulating oxidation layer has a thicker portion which is larger in thickness than a portion of the insulating oxidation layer underlying the gate electrode and located between the gate electrode and at least one of the source and drain electrodes. The arrangement increases the drain breakdown voltage of the drain electrode and reduces a drain leakage current so that the operating voltage of the semiconductor device is increased and the output thereof is increased easily.

A first method for fabricating a semiconductor device comprises: a first step of forming a first nitride semiconductor layer over a substrate; a second step of forming a second nitride semiconductor layer on the first nitride semiconductor layer and oxidizing the formed second nitride semiconductor layer to form an insulating oxidation layer composed of the second nitride semiconductor layer; a third step of forming a gate electrode on the insulating oxidation layer; and a fourth step of performing selective etching with respect to regions of the insulating oxidation layer which are located on both sides of the gate electrode to form openings in the insulating oxidation layer and forming source and drain electrodes in the formed openings.

The first method for fabricating a semiconductor device forms the insulating oxidation layer composed of the second nitride semiconductor layer by oxidizing the second nitride semiconductor layer and forms the gate electrode on the formed insulating oxidation layer so that the semiconductor device according to the present invention is surely obtained.

In the first method for fabricating a semiconductor device according to the present invention, an oxidation rate for the first nitride semiconductor layer is preferably lower than an oxidation rate for the second nitride semiconductor layer.

In the first method for fabricating a semiconductor device according to the present invention, each of the first and second nitride semiconductor layers is preferably composed of the same material.

Preferably, the first method for fabricating a semiconductor device further comprises, prior to the first step, the step of: forming, on the substrate, an active layer composed of a third nitride semiconductor having an energy gap smaller than in the first nitride semiconductor layer.

Preferably, the first method for fabricating a semiconductor device further comprises, between the first and second steps, the step of: forming, on the first nitride semiconductor layer, an anti-oxidation layer composed of a fourth nitride semiconductor having an oxidation rate lower than an oxidation rate for the second nitride semiconductor layer. Since the anti-oxidation layer having the oxidation rate lower than that of the second nitride semiconductor layer is thus formed between the second nitride semiconductor layer forming the insulating oxidation layer as the gate insulating film and the first nitride semiconductor layer formed thereunder, the fourth nitride semiconductor layer is less likely to be oxidized than the second nitride semiconductor layer so that only the second nitride semiconductor layer is oxidized easily. This effects easy control of the film thickness of the insulating oxidation layer serving as the gate insulating film which greatly affects the operating characteristic of the transistor.

In this case, the anti-oxidation layer preferably contains aluminum.

Preferably, the first method for fabricating a semiconductor device further comprises, between the second and third steps, the step of: forming an insulating film on the insulating oxidation layer, wherein the fourth step includes the step of: forming openings also in regions of the insulating film to be formed with the source and drain electrodes.

In this case, the insulating film is preferably composed of a silicon oxide film or a silicon nitride film.

In the first method for fabricating a semiconductor device, the second step preferably includes the steps of: forming the insulating oxidation layer on at least a region of the second nitride semiconductor layer to be formed with the gate electrode; and selectively oxidizing a region between the gate-electrode formation region and a region to be formed with the drain electrode to form the insulating oxidation layer with a thicker portion which is larger in thickness than the insulating oxidation layer.

A second method for fabricating a semiconductor device according to the present invention comprises: a first step of forming a first nitride semiconductor layer over a substrate; a second step of forming a second nitride semiconductor layer on the first nitride semiconductor layer; a third step of forming an anti-oxidation protective film on regions of the second nitride semiconductor layer to be formed with ohmic electrodes; a fourth step of oxidizing the second nitride semiconductor layer by using the anti-oxidation protective film as a mask to form an insulating oxidation layer in the second nitride semiconductor layer except for the ohmic-electrode formation regions; a fifth step of removing the anti-oxidation protective film and forming the ohmic electrodes on the ohmic-electrode formation regions of the second nitride semiconductor layer; and selectively forming a gate electrode on the insulating oxidation layer.

In accordance with the second method for fabricating a semiconductor device, the regions of the second nitride semiconductor layer to be formed with the ohmic electrodes are not oxidized so that the ohmic electrodes are formed without removing the second nitride semiconductor layer. This obviates the necessity to process the second nitride semiconductor layer.

In the second method for fabricating a semiconductor device, the anti-oxidation protective film is preferably composed of silicon. In the second method for fabricating a semiconductor device, the anti-oxidation protective film is preferably an insulating film.

Preferably, the second method for fabricating a semiconductor device further comprises, between the second and third steps, the steps of: forming, on the second nitride semiconductor layer, a protective film covering a region of the second nitride semiconductor layer to be formed with a device; and oxidizing the first and second nitride semiconductor layers by using the formed protective film as a mask to form an isolation film in a peripheral portion of the device formation region, wherein the third step includes the step of: forming the anti-oxidation protective film from the protective film.

Preferably, the second method for fabricating a semiconductor device further comprises, prior to the first step, the step of: forming, on the substrate, an active layer composed of a third nitride semiconductor having an energy gap smaller than in the first nitride semiconductor layer.

Preferably, the second method for fabricating a semiconductor device further comprises, between the first and second steps, the step of: forming, on the first nitride semiconductor layer, an anti-oxidation layer composed of a fourth nitride semiconductor having an oxidation rate lower than an oxidation rate for the second nitride semiconductor layer.

In this case, the anti-oxidation layer preferably contains aluminum.

In the first or second method for fabricating a semiconductor device, the first nitride semiconductor layer preferably contains aluminum.

BRIEF DESCRIPTION OF THE DRAWINGS

FIGS. 12A and 12B are structural cross-sectional views illustrating the process steps of the method for fabricating the semiconductor device according to the third embodiment;

DETAILED DESCRIPTION OF THE INVENTION

Embodiment 1

A first embodiment of the present invention will be described with reference to the drawings.

Figure 1:
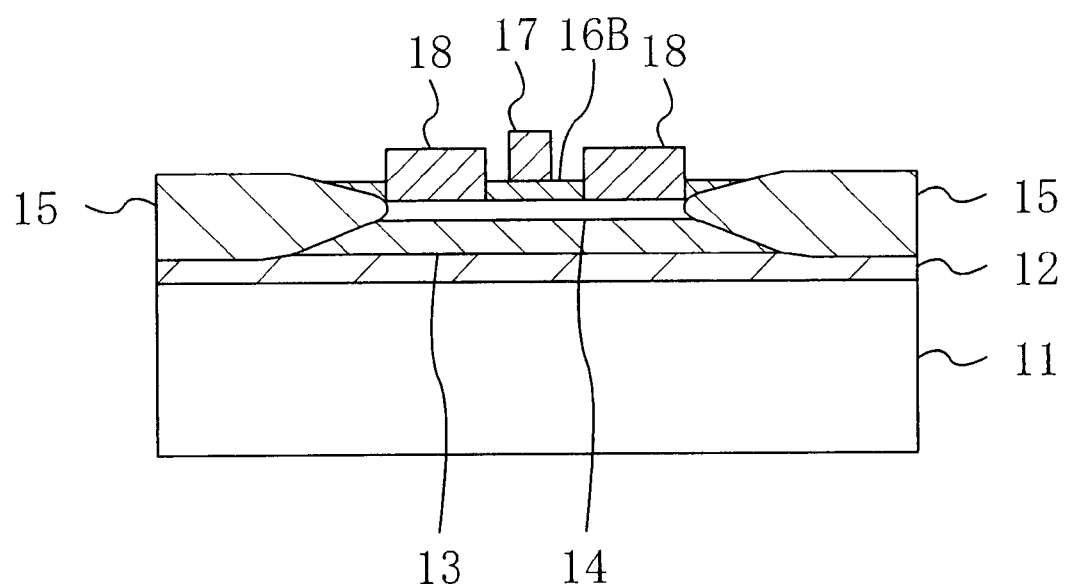
FIG. 1 is a structural cross-sectional view of a semiconductor device according to a first embodiment of the present invention.

FIG. 1 is a cross-sectional structure of a semiconductor device according to the first embodiment, which is an insulating-gate high electron mobility transistor (HEMT) composed of Group III–V nitride semiconductors.

As shown in FIG. 1, a buffer layer 12 composed of aluminum nitride (AlN) for reducing the lattice mismatching between a substrate 11 composed of, e.g., silicon carbide (SiC) and an epitaxial layer to be grown on the substrate 11, a channel layer 13 as an active layer composed of gallium nitride and having a two-dimensional electron gas layer to be formed in the upper portion thereof, and a carrier supply layer 14 composed of n-type aluminum gallium nitride (AlGaN) for supplying carriers (electrons) to the channel layer 13 are formed successively on the substrate 11 composed of silicon carbide (SiC).

An insulating oxidation layer 16B obtained by oxidizing a semiconductor layer composed of gallium nitride grown on the carrier supply layer 14 is formed selectively on the region of the carrier supply layer 14 to be formed with a gate electrode. The gate-electrode formation region is contained in a region to be formed with a device which is surrounded by an isolation film 15 composed of an insulating material reaching the buffer layer 12.

A gate electrode 17 composed of a multilayer structure consisting of titanium (Ti), platinum (Pt), and gold (Au) is formed on the insulating oxidation layer 16B. Source and drain electrodes 18 composed of titanium (Ti) and aluminum (Al) each in ohmic contact with the carrier supply layer 14 are formed on the regions of the carrier supply layer 14 which are located on both sides of the gate electrode 17.

Since the HEMT according to the present embodiment has thus used, as a gate insulating film, the insulating oxidation layer 16B formed by oxidizing the nitride semiconductor layer grown on the carrier supply layer 14, the interface between the insulating oxidation layer 16B and the carrier supply layer 14 is free from an impurity resulting from contamination or the like, resulting in an excellent interface. In addition, the insulating oxidation layer 16B formed by oxidizing a nitride has an extremely dense film texture and a high insulating property.

Figure 2:
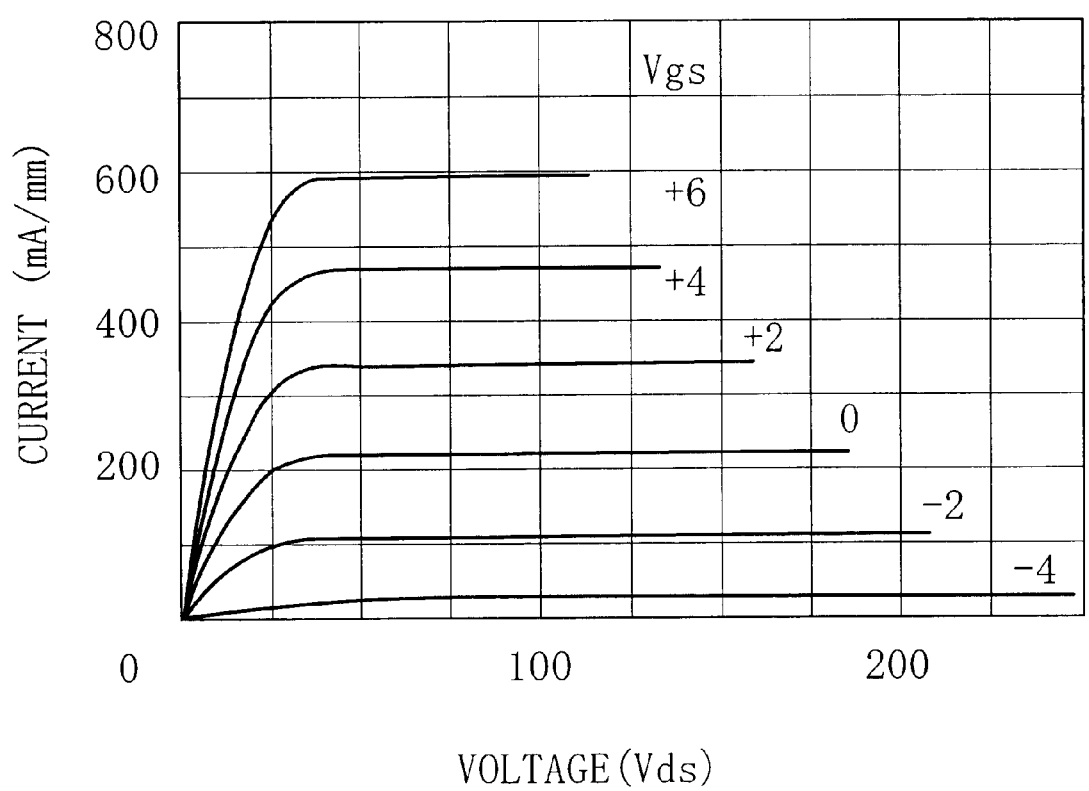
FIG. 2 is a graph showing a current-voltage characteristic in the semiconductor device according to the first embodiment.

FIG. 2 shows the current-voltage characteristic of the HEMT according to the first embodiment, in which the abscissa represents a source-drain voltage value Vds and the ordinate represents a current value on a per gate-width basis. In the HEMT according to the present embodiment, the insulating oxidation layer 16B as the gate insulating film has an excellent insulating property so that the drain breakdown voltage reaches 200 V or more. Even if a gate-source voltage Vgs of 5 V or more is applied in the forward direction, a leakage current does not flow from the gate electrode 17, which shows an excellent current-voltage characteristic.

A description will be given herein below to a method for fabricating the HEMT having the insulating gate thus constructed.

FIGS. 3A, 3B, and 3C and FIGS. 4A and 4B show the cross-sectional structures of the insulating-gate HEMT according to the first embodiment in the individual process steps of a fabrication method therefor.

Figure 3A:
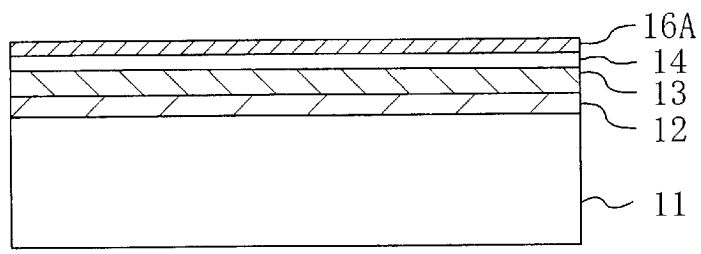
FIGS. 3A, 3B, and 3C are structural cross-sectional views illustrating the process steps of a method for fabricating the semiconductor device according to the first embodiment.

First, as shown in FIG. 3A, the buffer layer 12 composed of aluminum nitride with a film thickness of, e.g., about 100 nm, the channel layer 13 composed of gallium nitride with a film thickness of about 10 nm, the carrier supply layer 14 composed of n-type aluminum gallium nitride with a film thickness of about 15 nm for doping silicon (Si), and an insulating-film forming layer 16A composed of gallium nitride with a film thickness of about 50 nm to 100 nm are grown successively by metal organic chemical vapor deposition (MOCVD) on the substrate 11 composed of silicon carbide, whereby an epitaxial multilayer structure composed of nitride semiconductors is formed.

Figure 3B:
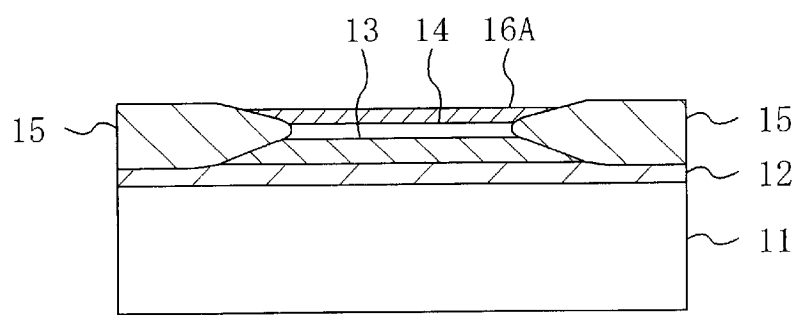

Next, as shown in FIG. 3B, a protective film (not shown) composed of silicon for masking the isolation formation region is formed by lithography and etching. Subsequently, a thermal oxidation process is performed with respect to the substrate 11 in an oxidizing ambient for about 1 to 2 hours, thereby selectively forming the isolation film 15 in the epitaxial multilayer structure.

Figure 3C:
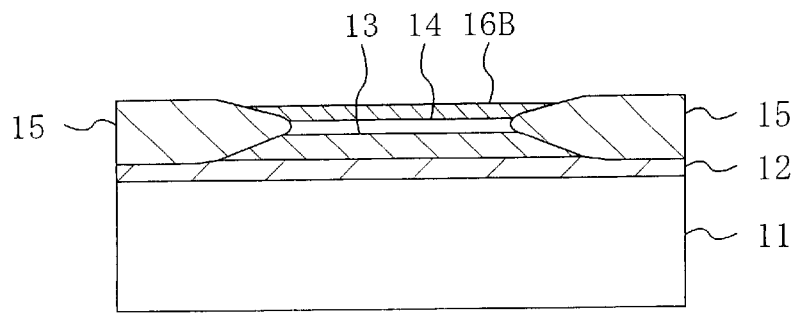

Next, as shown in FIG. 3C, the protective film is removed. Then, a thermal oxidation process is performed with respect to the insulating-film forming layer 16A in an oxidizing ambient for about several minutes, thereby forming the insulating oxidation layer 16B from the insulating-film forming layer 16A.

Figure 4A:
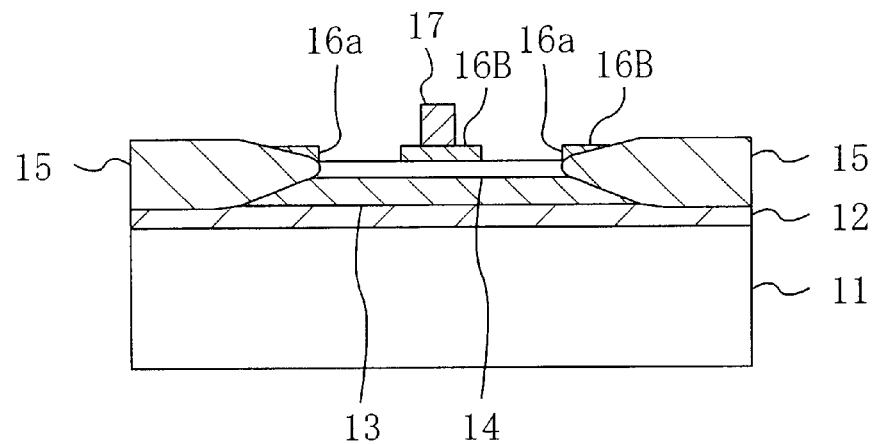
FIGS. 4A and 4B are structural cross-sectional views illustrating the process steps of the method for fabricating the semiconductor device according to the first embodiment.

Next, as shown in FIG. 4A, titanium and platinum having a total film thickness of about 50 nm and gold with a film thickness of about 200 nm are stacked in layers by, e.g., sputtering to form a gate-electrode forming film. Subsequently, selective patterning is performed with respect to the gate-electrode forming film to form the gate electrode 17 therefrom. Thereafter, selective etching is performed with respect to the regions of the insulating oxidation layer 16B which are located on both sides of the gate electrode 17 to form openings 16a in the insulating oxidation layer 16B, thereby exposing the carrier supply layer 14 through the openings 16a.

Figure 4B:
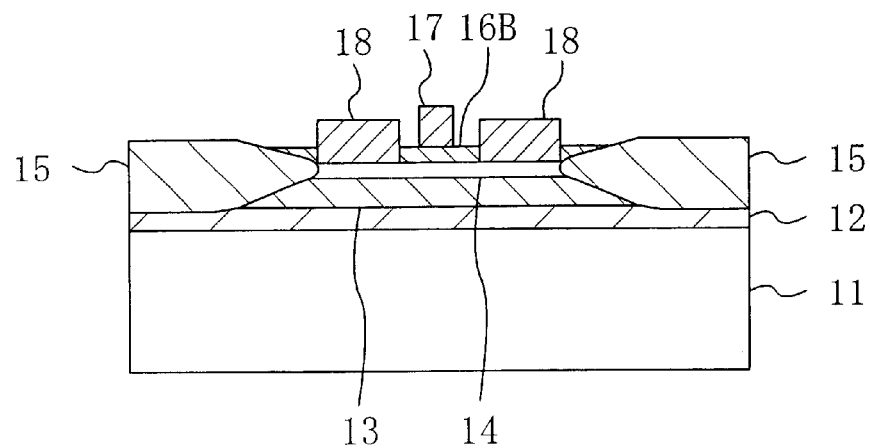

Next, as shown in FIG. 4B, titanium with a film thickness of about 20 nm and aluminum with a film thickness of about 200 nm are stacked in layers by, e.g., sputtering on the portions of the carrier supply layer 14 exposed through the openings 16a. Subsequently, patterning is performed as specified with respect to the deposited metal films by lithography and dry etching, followed by a heat treatment, whereby the source and drain electrodes 18 each in ohmic contact with the carrier supply layer 14 are formed from the metal films.

Thus, the method for fabricating the HEMT according to the first embodiment grows the insulating-film forming layer 16A composed of gallium nitride on the top surface of the epitaxial multilayer structure and thermally oxidizes the grown insulating-film forming layer 16A, thereby forming the insulating oxidation layer 16B serving as the gate insulating film.

In the first embodiment, the film thickness of the insulating oxidation layer 16B is adjusted by a heating time for the insulating-film forming layer 16A. If a comparison is made between an oxidation rate for the insulating-film forming layer 16A composed of gallium nitride (GaN) and an oxidation rate for the carrier supply layer 14 composed of aluminum gallium nitride (AlGaN), the oxidation rate for gallium nitride is as high as about double the oxidation rate for aluminum gallium nitride when the mole fraction of Al is 0.3. This prevents the oxidation of the carrier supply layer 14 underlying the insulating oxidation layer 16B.

Embodiment 2

A second embodiment of the present invention will be described with reference to the drawings.

Figure 5:
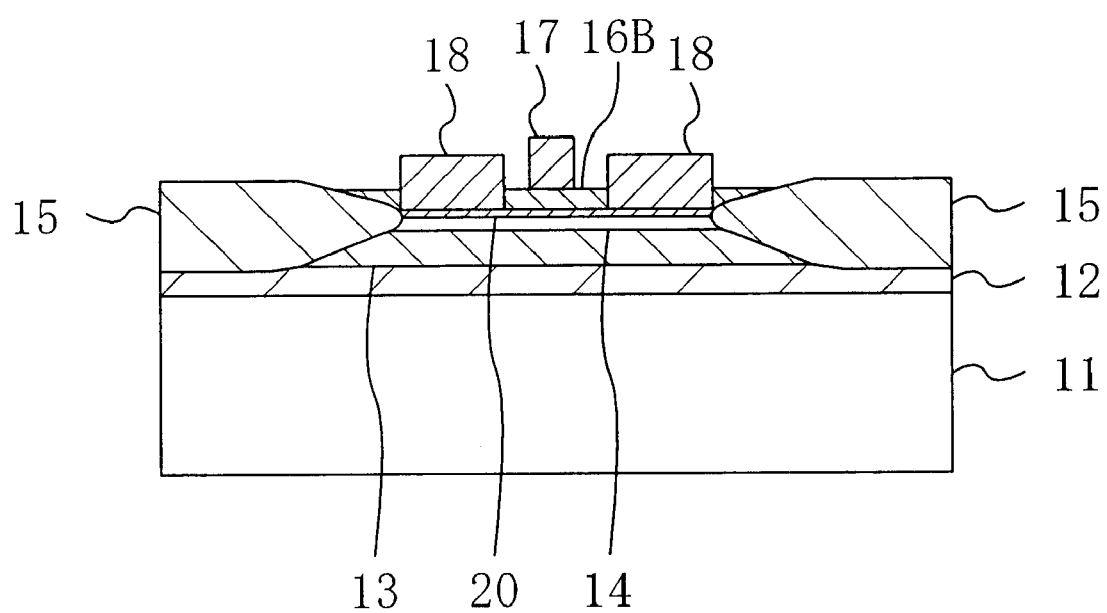
FIG. 5 is a structural cross-sectional view of a semiconductor device according to a second embodiment of the present invention.

FIG. 5 shows a cross-sectional structure of a semiconductor device according to the second embodiment, which is an insulating-gate HEMT composed of Group III–V nitride semiconductors. In FIG. 5, the same components as shown in FIG. 1 are designated by the same reference numerals.

As shown in FIG. 5, a buffer layer 12 composed of aluminum nitride, a channel layer 13 composed of gallium nitride, a carrier supply layer 14 composed of n-type aluminum gallium nitride for supplying carriers (electrons) to the channel layer 13, and an anti-oxidation layer 20 composed of aluminum nitride are formed successively on a substrate 11 composed of silicon carbide.

An insulating oxidation layer 16B obtained by oxidizing a semiconductor layer composed of gallium nitride grown on the anti-oxidation layer 20 is formed selectively on the gate-electrode formation region of the anti-oxidation layer 20 which is contained in the device formation region surrounded by an isolation film 15 composed of an insulating material reaching the buffer layer 12.

A gate electrode 17 composed of a multilayer structure consisting of titanium, platinum, and gold is formed on the insulating oxidation layer 16B. Source and drain electrodes 18 composed of titanium and aluminum each in ohmic contact with the anti-oxidation layer 20 are formed on the regions of the anti-oxidation layer 20 which are located on both sides of the gate electrode 17.

Thus, the HEMT according to the second embodiment is characterized in that the anti-oxidation layer 20 composed of aluminum nitride is formed between the insulating oxidation layer 16B serving as a gate insulating film and the carrier supply layer 14. This allows the formation of an excellent interface between the insulating oxidation layer 16B and the anti-oxidation layer 20 which is free from an impurity resulting from contamination or the like, similarly to the first embodiment. In addition, the insulating oxidation layer 16B formed by oxidizing a nitride has an extremely dense film texture and an excellent insulating property.

It is to be noted that the anti-oxidation layer 20 functions as an oxidation stopper layer during the oxidation process for forming the insulating oxidation layer 16B.

Figure 6:
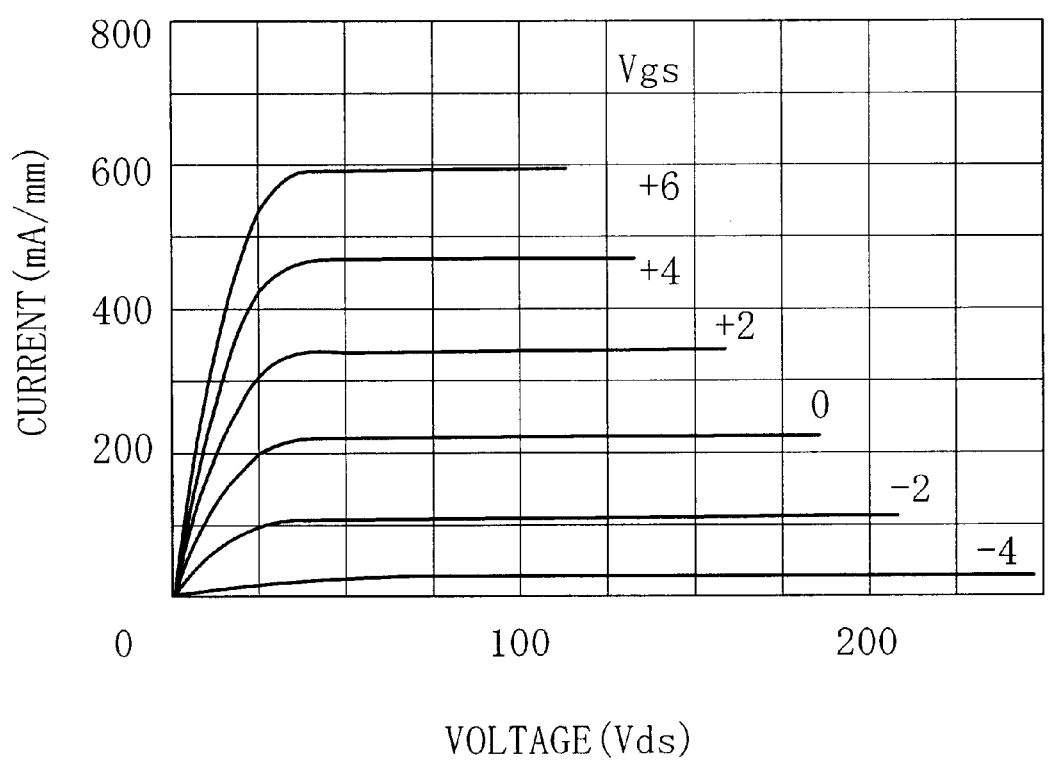
FIG. 6 is a graph showing a current-voltage characteristic in the semiconductor device according to the second embodiment.

FIG. 6 shows the current-voltage characteristic of the HEMT according to the second embodiment, in which the abscissa represents a source-drain voltage value Vds and the ordinate represents a current value on a per gate-width basis. In the HEMT according to the present embodiment, the insulating oxidation layer 16B as the gate insulating film has an excellent insulating property so that the drain breakdown voltage reaches 200 V or more. Even if a gate-source voltage Vgs of 5 V or more is applied in the forward direction, a leakage current does not flow from the gate electrode 17, which shows an excellent current-voltage characteristic.

A description will be given herein below to a method for fabricating the HEMT having the insulating gate thus constructed.

FIGS. 7A, 7B, and 7C and FIGS. 8A and 8B show the cross-sectional structures of the insulating-gate HEMT according to the second embodiment in the individual process steps of a fabrication method therefor.

Figure 7A:
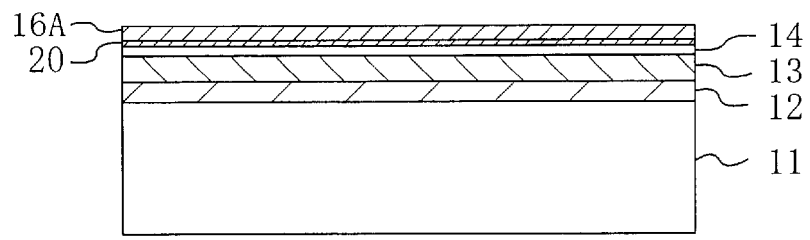
FIGS. 7A, 7B, and 7C are structural cross-sectional views illustrating the process steps of a method for fabricating the semiconductor device according to the second embodiment.

First, as shown in FIG. 7A, the buffer layer 12 composed of aluminum nitride with a film thickness of, e.g., about 100 nm, the channel layer 13 composed of gallium nitride with a film thickness of about 10 nm, the carrier supply layer 14 composed of n-type aluminum gallium nitride with a film thickness of about 15 nm for doping silicon, the anti-oxidation layer 20 composed of aluminum nitride with a film thickness of about 20 nm to 50 nm, and an insulating-film forming layer 16A composed of gallium nitride with a film thickness of about 50 nm to 100 nm are grown successively by MOCVD on the substrate 11 composed of silicon carbide, whereby an epitaxial multilayer structure composed of nitride semiconductors is formed.

Figure 7B:
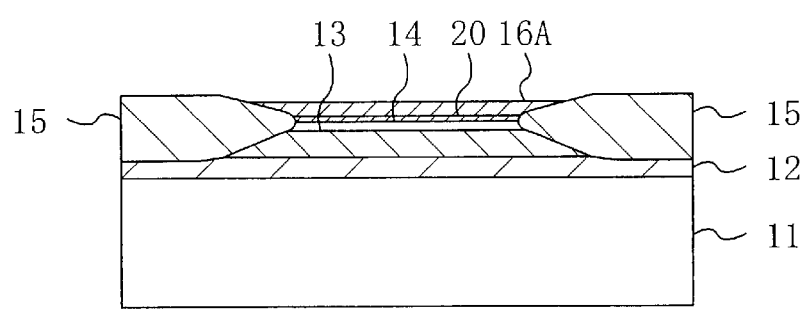

Next, as shown in FIG. 7B, a protective film (not shown) composed of silicon for masking the isolation formation region is formed by lithography and etching. Subsequently, a thermal oxidation process is performed with respect to the substrate 11 in an oxidizing ambient for about 1 to 2 hours, thereby selectively forming the isolation film 15 in the epitaxial multilayer structure.

Figure 7C:
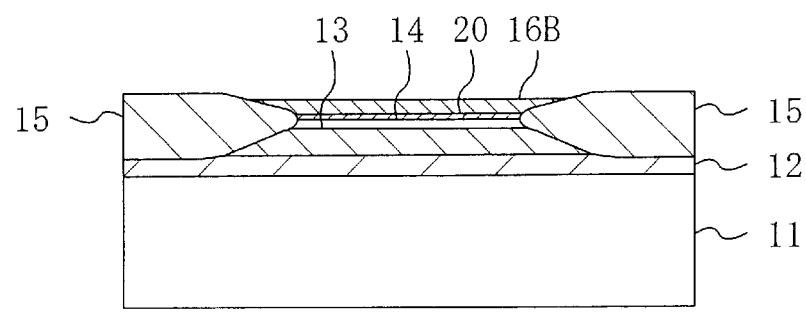

Next, as shown in FIG. 7C, the protective film is removed. Then, a thermal oxidation process is performed with respect to the insulating-film forming layer 16A in an oxidizing ambient for about several minutes, thereby forming the insulating oxidation layer 16B from the insulating-film forming layer 16A.

In the second embodiment also, the film thickness of the insulating oxidation layer 16B is adjusted by controlling a heating time for the insulating-film forming layer 16A. However, since an oxidation rate for aluminum nitride composing the anti-oxidation layer 20 is as low as one fiftieth of an oxidation rate for gallium nitride, the oxidization process for the insulating-film forming layer 16A can be considered to have halted at the anti-oxidation layer 20. Even if the insulating-film forming layer 16A is entirely oxidized, the oxidation does not reach the carrier supply layer 14 and therefore the film thickness of the insulating oxidation layer 16B can substantially be adjusted by controlling the film thickness of the insulating-film forming layer 16A. This significantly improves controllability over the film thickness of the insulating oxidation layer 16B which greatly affects the operating characteristic of the device having the insulating gate.

Figure 8A:
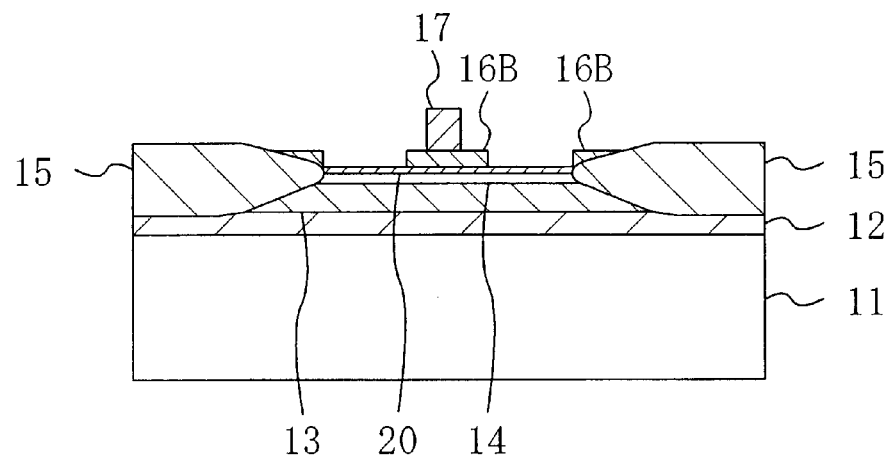
FIGS. 8A and 8B are structural cross-sectional views illustrating the process steps of the method for fabricating the semiconductor device according to the second embodiment.

Next, as shown in FIG. 8A, titanium and platinum having a total film thickness of about 50 nm and gold with a film thickness of about 200 nm are stacked in layers by, e.g., sputtering to form a gate-electrode forming film. Subsequently, selective patterning is performed with respect to the gate-electrode forming film to form the gate electrode 17 therefrom. Thereafter, selective etching is performed with respect to the regions of the insulating oxidation layer 16B which are located on both sides of the gate electrode 17 to form openings 16a in the insulating oxidation layer 16B, thereby exposing the anti-oxidation layer 20 through the openings 16a.

Figure 8B:
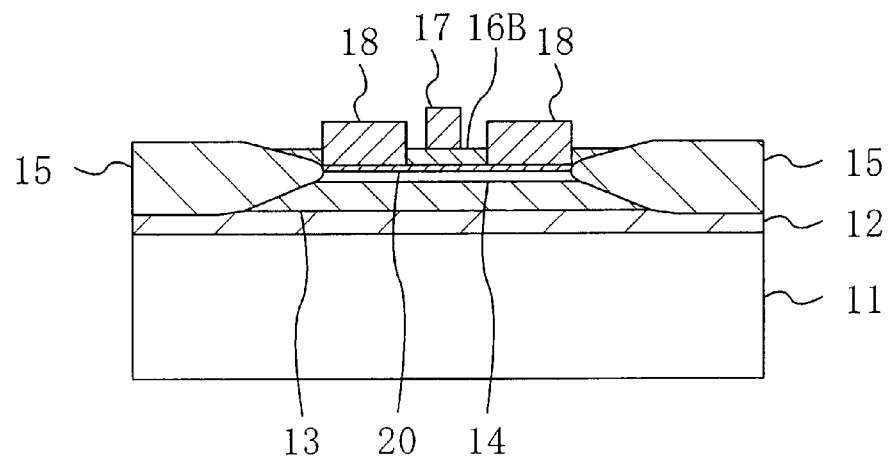

Next, as shown in FIG. 8B, titanium with a film thickness of about 20 nm and aluminum with a film thickness of about 200 nm are stacked in layers by, e.g., sputtering on the portions of the anti-oxidation layer 20 exposed through the openings 16a. Subsequently, patterning is performed as specified with respect to the deposited metal films by lithography and dry etching, followed by a heat treatment, whereby the source and drain electrodes 18 each in ohmic contact with the anti-oxidation layer 20 are formed from the metal films.

It is to be noted that a material composing the anti-oxidation layer 20 is not limited to aluminum nitride. The anti-oxidation layer 20 may contain gallium or indium as a Group III–V element. To reduce the oxidation rate, however, the proportion of aluminum contained in the anti-oxidation layer 20 is preferably increased relatively.

Embodiment 3

A third embodiment of the present invention will be described with reference to the drawings.

Figure 9:
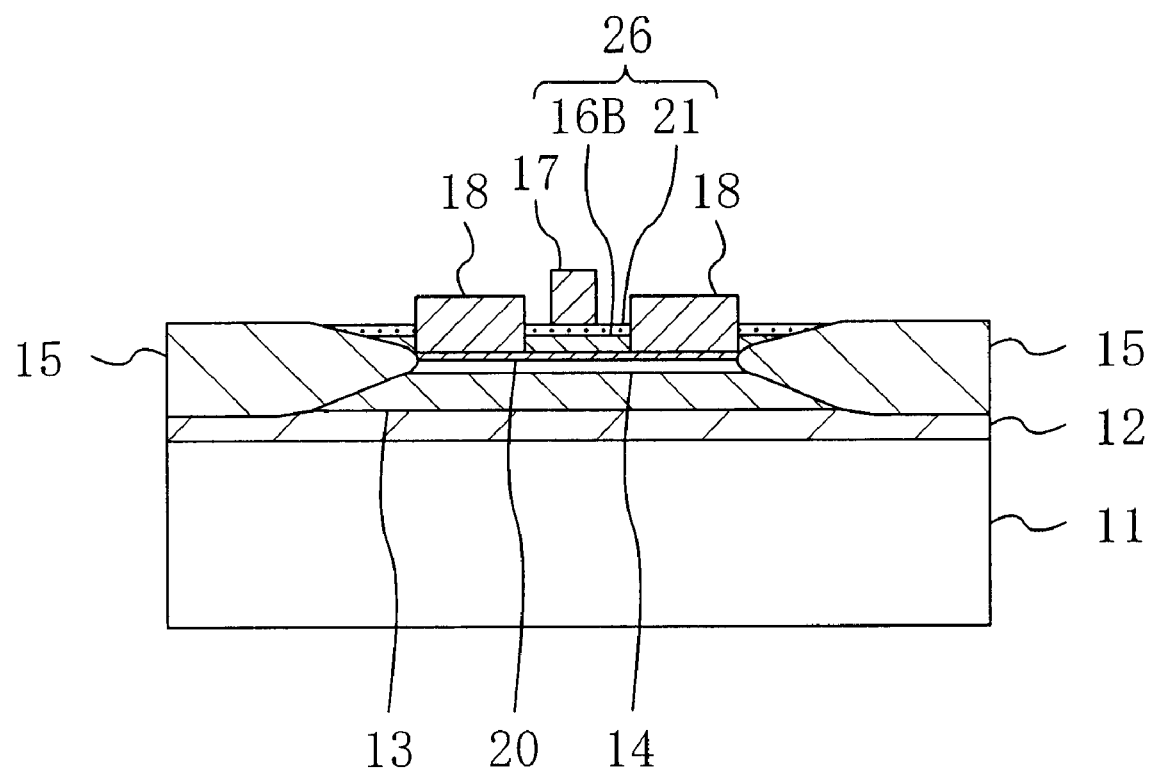
FIG. 9 is a structural cross-sectional view of a semiconductor device according to a third embodiment of the present invention.

FIG. 9 shows a cross-sectional structure of a semiconductor device according to the third embodiment, which is an insulating-gate HEMT composed of Group III–V nitride semiconductors. In FIG. 9, the same components as shown in FIG. 1 are designated by the same reference numerals.

As shown in FIG. 9, a buffer layer 12 composed of aluminum nitride (AlN) for reducing the lattice mismatching between a substrate 11 composed of, e.g., silicon carbide (SiC) and an epitaxial layer to be grown on the substrate 11, a channel layer 13 as an active layer composed of gallium nitride and having a two-dimensional electron gas layer to be formed in the upper portion thereof, a carrier supply layer 14 composed of n-type aluminum gallium nitride (AlGaN) for supplying carriers (electrons) to the channel layer 13, and an anti-oxidation layer 20 composed of aluminum nitride are formed successively on the substrate 11 composed of silicon carbide.

An insulating oxidation layer 16B obtained by oxidizing a semiconductor layer composed of gallium nitride grown on the anti-oxidation layer 20 is formed selectively on the gate-electrode formation region of the anti-oxidation layer 20 which is contained in the device formation region surrounded by an isolation film 15 composed of an insulating material reaching the buffer layer 12. An upper gate insulating film 21 composed of silicon dioxide ($SiO_2$) is further formed on the insulating oxidation layer 16B. Thus, according to the third embodiment, a gate insulating film 26 is constituted by a lower gate insulating film composed of the insulating oxidation layer 16B and the upper gate insulating film 21.

A gate electrode 17 composed of a multilayer structure consisting of titanium, platinum, and gold is formed on the gate insulating film 26. Source and drain electrodes 18 composed of titanium (Ti) and aluminum (Al) each in ohmic contact with the anti-oxidation layer 20 are formed on the regions of the anti-oxidation layer 20 which are located on both sides of the gate electrode 17.

Since the HEMT according to the present embodiment has thus used, as a lower gate insulating film, the insulating oxidation layer 16B formed by oxidizing the nitride semiconductor layer grown on the carrier supply layer 14, the interface between the insulating oxidation layer 16B and the carrier supply layer 14 is free from an impurity resulting from contamination or the like, resulting in an excellent interface. In addition, the insulating oxidation layer 16B formed by oxidizing a nitride has an extremely dense film texture and a high insulating property.

Since the third embodiment has further provided the upper gate insulating film 21 composed of silicon dioxide between the gate electrode 17 and the insulating oxidation layer 16B, a leakage current due to the gate electrode 17 seldom flows. This allows a relatively high voltage to be applied to the gate electrode 17 and further enhances the current driving ability of the HEMT.

Figure 10:
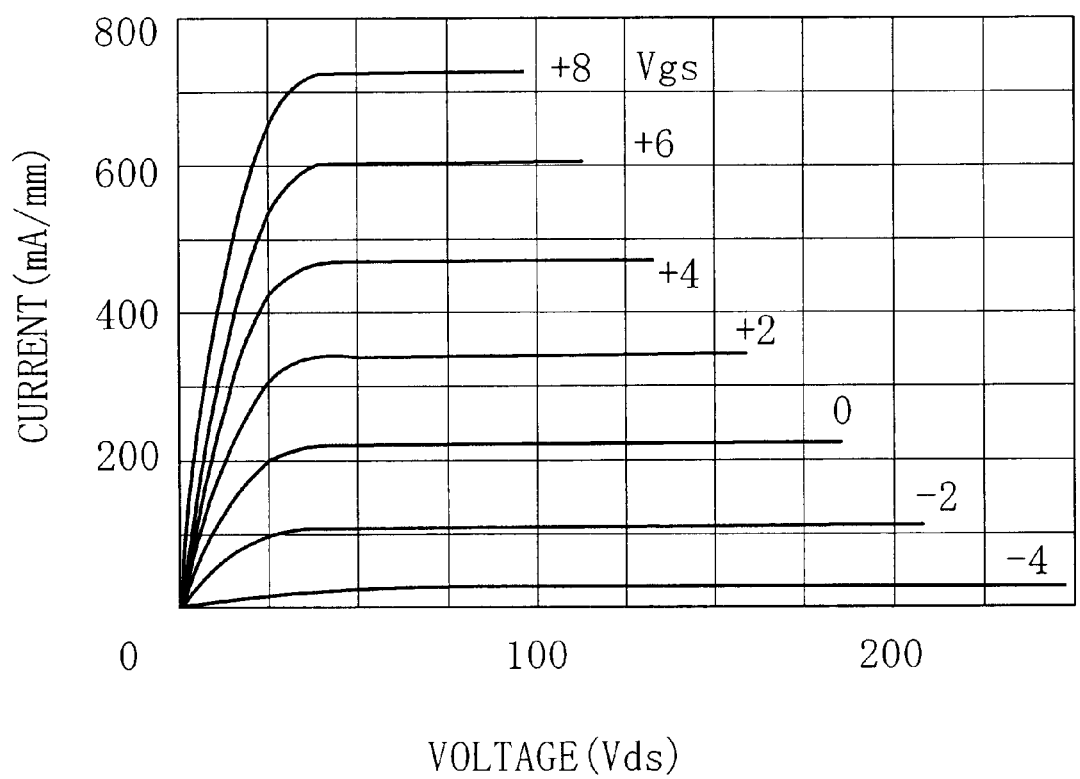
FIG. 10 is a graph showing a current-voltage characteristic in the semiconductor device according to the third embodiment.

FIG. 10 shows the current-voltage characteristic of the HEMT according to the third embodiment, in which the abscissa represents a source-drain voltage value Vds and the ordinate represents a current value on a per gate-width basis. In the HEMT according to the present embodiment, the gate insulating film 26 is constituted by the insulating oxidation layer 16B and the upper gate insulating film 21 to have an excellent insulating property so that the drain breakdown voltage reaches 200 V or more. Even if a gate-source voltage Vgs of 8 V or more is applied in the forward direction, a leakage current does not flow from the gate electrode 17, which shows an excellent current-voltage characteristic.

A description will be given herein below to a method for fabricating the HEMT having the insulating gate thus constructed.

FIGS. 11A, 11B, and 11C and FIGS. 12A and 12B show the cross-sectional structures of the insulating-gate HEMT according to the third embodiment in the individual process steps of a fabrication method therefor.

Figure 11A:
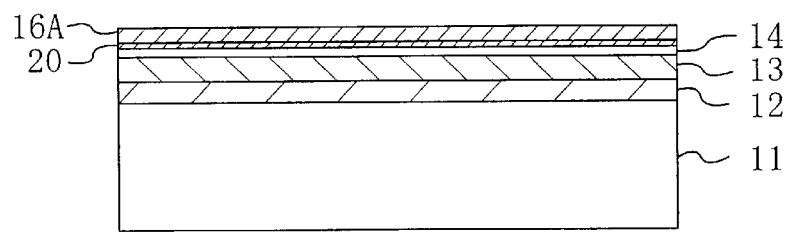
FIGS. 11A, 11B, and 11C are structural cross-sectional views illustrating the process steps of a method for fabricating the semiconductor device according to the third embodiment.

First, as shown in FIG. 11A, the buffer layer 12 composed of aluminum nitride with a film thickness of, e.g., about 100 nm, the channel layer 13 composed of gallium nitride with a film thickness of about 10 nm, the carrier supply layer 14 composed of n-type aluminum gallium nitride with a film thickness of about 15 nm for doping silicon (Si), the anti-oxidation layer 20 composed of aluminum nitride with a film thickness of about 20 nm to 50 nm, and an insulating-film forming layer 16A composed of gallium nitride with a film thickness of about 50 nm to 100 nm are grown successively by MOCVD on the substrate 11 composed of silicon carbide, whereby an epitaxial multilayer structure composed of nitride semiconductors is formed.

Next, a protective film (not shown) composed of silicon for masking the isolation formation region is formed by lithography and etching. Subsequently, a thermal oxidation process is performed with respect to the substrate 11 in an oxidizing ambient for about 1 to 2 hours, thereby selectively forming the isolation film 15 in the epitaxial multilayer structure.

Figure 11B:
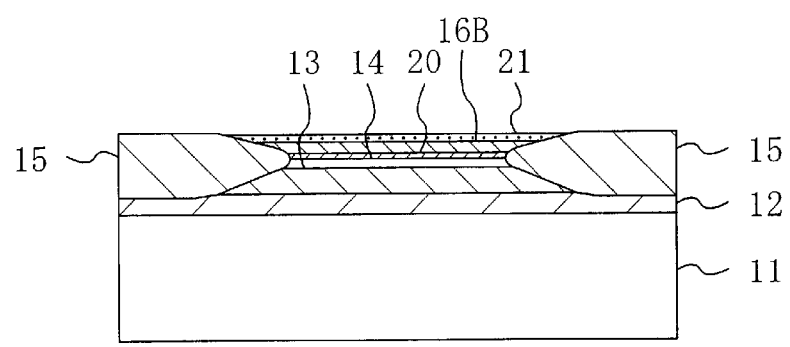
Figure 11C:
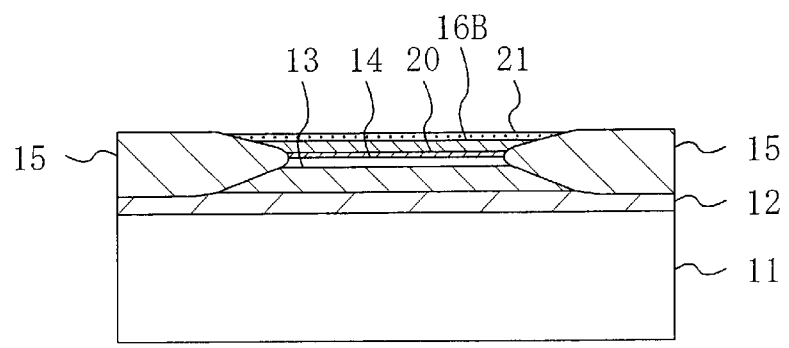

Next, as shown in FIG. 11B, the protective film is removed. Then, a thermal oxidation process is performed with respect to the insulating-film forming layer 16A in an oxidizing ambient for about several minutes, thereby forming the insulating oxidation layer 16B from the insulating-film forming layer 16A. Subsequently, the upper gate insulating film 21 composed of silicon dioxide with a film thickness of about 10 nm is formed by, e.g., CVD on the insulating oxidation layer 16B.

In the third embodiment also, the film thickness of the insulating oxidation layer 16B is adjusted by controlling a heating time for the insulating-film forming layer 16A. The provision of the anti-oxidation layer 20 under the insulating-film forming layer 16A allows the film thickness of the insulating oxidation layer 16B to be adjusted substantially by controlling the film thickness of the insulating-film forming layer 16A, similarly to the second embodiment. This significantly improves controllability over the film thickness of the insulating oxidation layer 16B which greatly affects the operating characteristic of the device having the insulating gate.

Next, as shown in FIG. 12A, titanium and platinum having a total film thickness of about 50 nm and gold with a film thickness of about 200 nm are stacked in layers by, e.g., sputtering to form a gate-electrode forming film. Subsequently, selective patterning is performed with respect to the gate-electrode forming film to form the gate electrode 17 therefrom. As a result, the gate insulating film 26 constituted by the upper gate insulating film 21 and the lower gate insulating film composed of the insulating oxidation layer 16B is formed under the gate electrode 17. Thereafter, selective etching is performed with respect to the regions of the upper gate insulating film 21 and the insulating oxidation layer 16B which are located on both sides of the gate electrode 17 to form openings 16a in the upper gate insulating film 21 and in the insulating oxidation layer 16B, thereby exposing the anti-oxidation layer 20 through the openings 16a.

Next, as shown in FIG. 12B, titanium with a film thickness of about 20 nm and aluminum with a film thickness of about 200 nm are stacked in layers by, e.g., sputtering on the portions of the anti-oxidation layer 20 exposed through the openings 16a. Subsequently, patterning is performed as specified with respect to the deposited metal films by lithography and dry etching, followed by a heat treatment, whereby the source and drain electrodes 18 each in ohmic contact with the anti-oxidation layer 20 are formed from the metal films.

Thus, the method for fabricating the HEMT according to the third embodiment constructs the gate insulating film 26 by the insulating oxidation layer 16B obtained by thermally oxidizing the insulating-film forming layer 16A composed of gallium nitride and by the upper gate insulating film 21 formed on the insulating oxidation layer 16B. This prevents a leakage current due to the gate electrode 17 and increases the voltage applied to the gate electrode 17, thereby enhancing the current driving ability of the HEMT.

Although the third embodiment has used silicon dioxide for the upper gate insulating film 21 of the gate insulating film 26, a material composing the upper gate insulating film 21 is not limited to silicon dioxide. Any material having excellent adhesion to the oxide insulating layer 16B and an insulating property higher than the oxide insulating layer 16B can be used to compose the upper gate insulating film 21. For example, silicon nitride ($Si_3N_4$) may be used.

Embodiment 4

A fourth embodiment of the present invention will be described with reference to the drawings.

Figure 13:
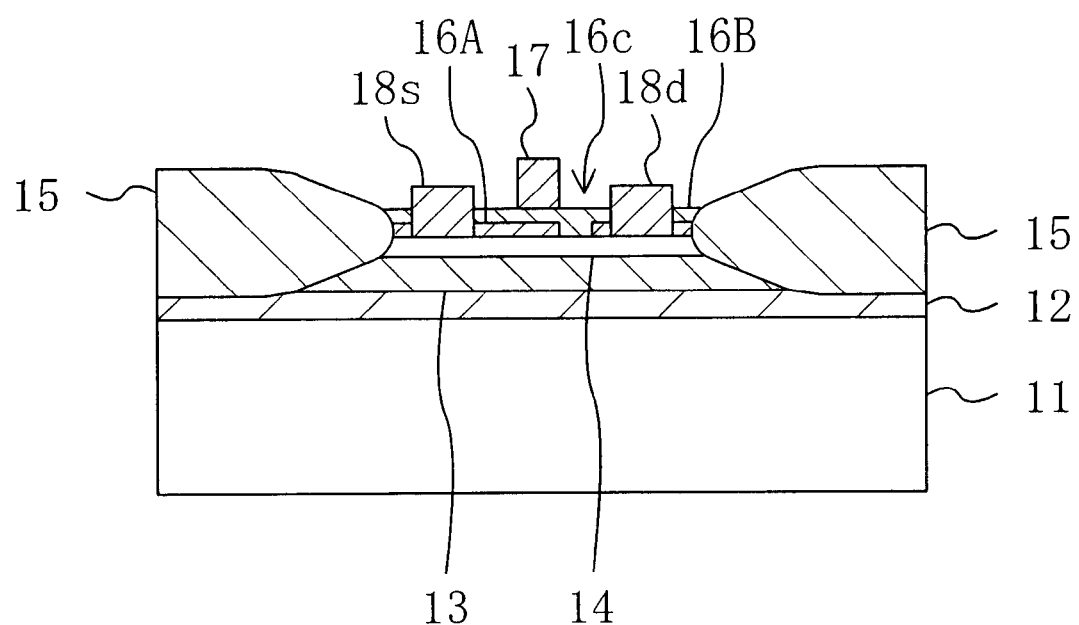
FIG. 13 is a structural cross-sectional view of a semiconductor device according to a fourth embodiment of the present invention.

FIG. 13 shows a cross-sectional structure of a semiconductor device according to the fourth embodiment, which is an insulating-gate HEMT composed of Group III–V nitride semiconductors. In FIG. 13, the same components as shown in FIG. 1 are designated by the same reference numerals.

As shown in FIG. 13, a buffer layer 12 composed of aluminum nitride (AlN) for reducing the lattice mismatching between a substrate 11 composed of, e.g., silicon carbide (SiC) and an epitaxial layer to be grown on the substrate 11, a channel layer 13 as an active layer composed of gallium nitride and having a two-dimensional electron gas layer to be formed in the upper portion thereof, and a carrier supply layer 14 composed of n-type aluminum gallium nitride (AlGaN) for supplying carriers (electrons) to the channel layer 13 are formed successively on the substrate 11 composed of silicon carbide.

An insulating oxidation layer 16B obtained by oxidizing an insulating-film forming layer 16A composed of gallium nitride grown on the carrier supply layer 14 is formed selectively on the gate-electrode formation region of the carrier supply layer 14 which is contained in the device formation region surrounded by an isolation film 15 composed of an insulating material reaching the buffer layer 12.

A gate electrode 17 composed of a multilayer structure consisting of titanium, platinum, and gold is formed on the insulating oxidation layer 16B. A source electrode 18s and a drain electrode 18d composed of titanium and aluminum each in ohmic contact with the carrier supply layer 14 are formed on the regions of the carrier supply layer 14 which are located on both sides of the gate electrode 17.

In the fourth embodiment, the region of the insulating oxidation layer 16B located between the gate electrode 17 and the drain electrode 18d has a thicker portion 16c larger in thickness than the portion of the insulating oxidation layer 16B underlying the gate electrode 17, as shown in FIG. 13.

Since the HEMT according to the fourth embodiment has thus used, as a gate insulating film, the insulating oxidation layer 16B formed by oxidizing the insulating-film forming layer 16A composed of gallium nitride grown on the carrier supply layer 14, the interface between the carrier supply layer 14 and each of the insulating oxidation layer 16B and the insulating-film forming layer 16A is free from an impurity resulting from contamination or the like, resulting in an excellent interface. In addition, the insulating oxidation layer 16B formed by oxidizing a nitride has an extremely dense film texture and a high insulating property.

In addition, the region of the insulating oxidation layer 16B located between the gate electrode 17 and the drain electrode 18d is formed with the thicker portion 16c so that the drain breakdown voltage of the HEMT is increased and a drain leakage current is reduced. This increases the operating voltage of the HEMT and easily increases the output thereof.

Figure 14:
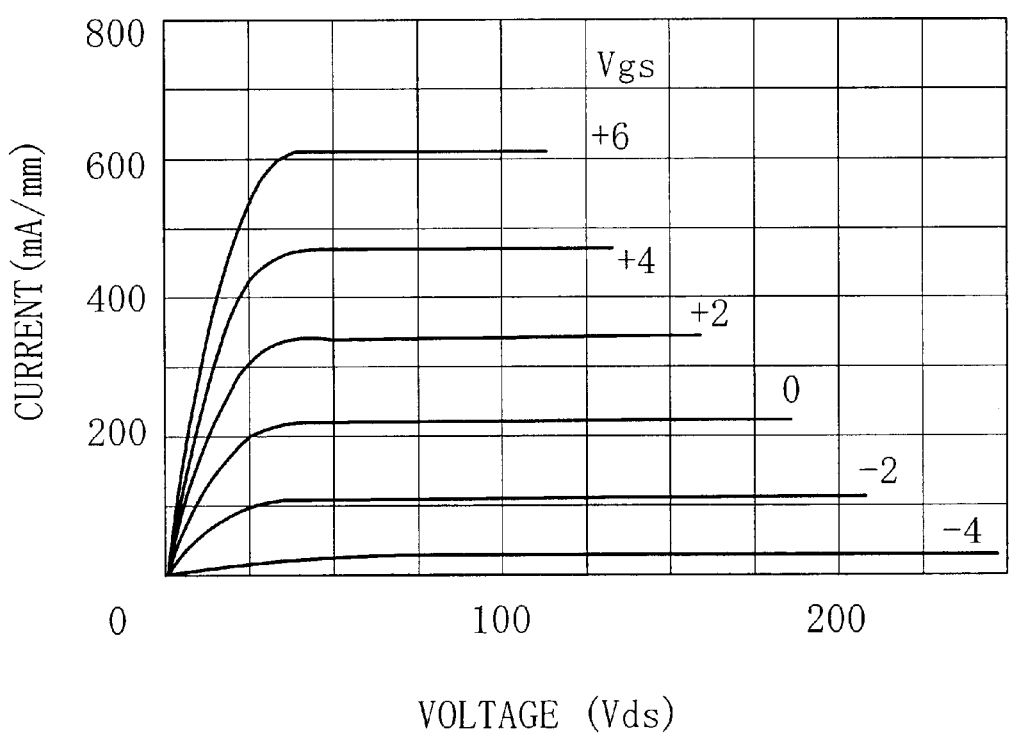
FIG. 14 is a graph showing a current-voltage characteristic in the semiconductor device according to the fourth embodiment.

FIG. 14 shows the current-voltage characteristic of the HEMT according to the fourth embodiment, in which the abscissa represents a source-drain voltage value Vds and the ordinate represents a current value on a per gate-width basis. In the HEMT according to the present embodiment, the insulating oxidation layer 16B as the gate insulating film has an excellent insulating property and the region of the insulating oxidation layer 16B located between the gate electrode 17 and the drain electrode 18d is formed with the thicker portion 16c having a larger thickness so that the drain breakdown voltage reaches 250 V or more. Even if a gate-source voltage Vgs of 6 V or more is applied in the forward direction, a leakage current does not flow from the gate electrode 17, which shows an excellent current-voltage characteristic.

A description will be given herein below to a method for fabricating the HEMT having the insulating gate thus constructed.

FIGS. 15A, 15B, 15C and 15D and FIGS. 16A, 16B, and 16C show the cross-sectional structures of the insulating-gate HEMT according to the fourth embodiment in the individual process steps of the fabrication method therefor.

Figure 15A:
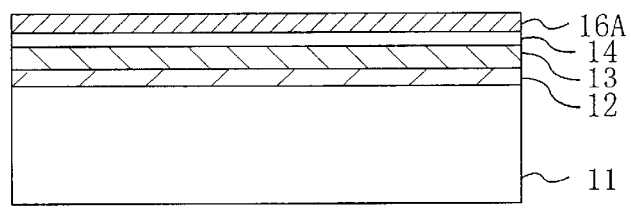
FIGS. 15A, 15B, 15C, and 15D are structural cross-sectional views illustrating the process steps of a method for fabricating the semiconductor device according to the fourth embodiment.

First, as shown in FIG. 15A, the buffer layer 12 composed of aluminum nitride with a film thickness of, e.g., about 100 nm, the channel layer 13 composed of gallium nitride with a film thickness of about 10 nm, the carrier supply layer 14 composed of n-type aluminum gallium nitride with a film thickness of about 15 nm for doping silicon, and the insulating-film forming layer 16A composed of gallium nitride with a film thickness of about 50 nm to 100 nm are grown successively by MOCVD on the substrate 11 composed of silicon carbide, whereby an epitaxial multilayer structure composed of nitride semiconductors is formed.

Figure 15B:
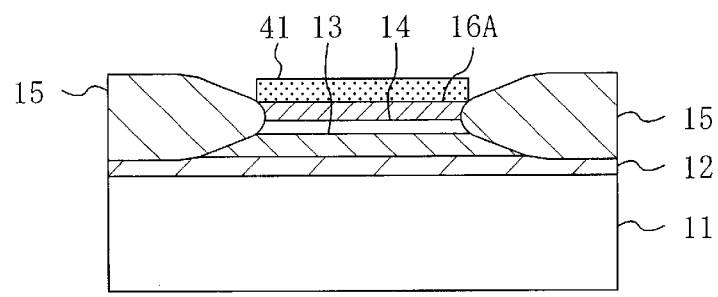

Next, as shown in FIG. 15B, a protective film 41 composed of silicon for masking the isolation formation region is formed by lithography and etching. Subsequently, a thermal oxidation process is performed with respect to the substrate 11 in an oxidizing ambient for about 1 to 2 hours, thereby selectively forming the isolation film 15 in the epitaxial multilayer structure.

Figure 15C:
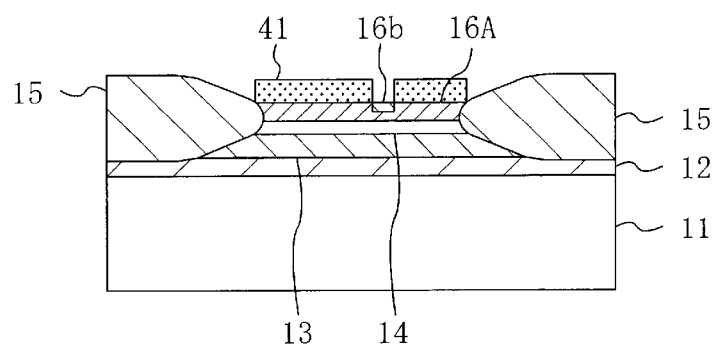

Next, as shown in FIG. 15C, an opening is formed in the region of the protective film 41 located between the regions thereof to be formed with the gate and drain electrodes, thereby exposing the insulating-film forming layer 16A. Then, a thermal oxidation process is performed with respect to the exposed insulating-film forming layer 16A in an oxidizing ambient for several minutes, thereby forming a thicker-portion forming portion 16b by partially oxidizing the region of the insulating-film forming layer 16A located between the gate-electrode formation region of the insulating-film forming layer 16A and the drain-electrode formation region thereof.

Figure 15D:
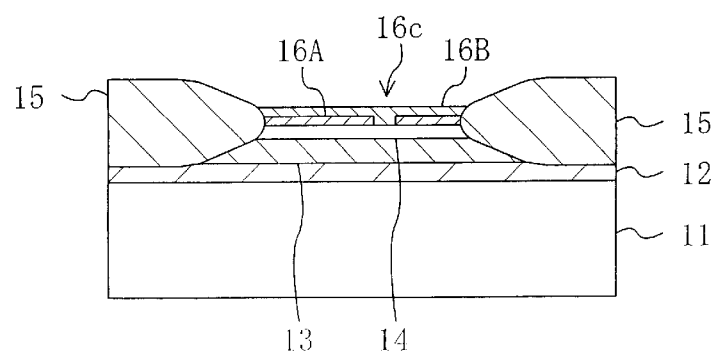

Next, as shown in FIG. 15D, the protective film 41 is removed. Then, a thermal oxidation process is performed with respect to the insulating-film forming layer 16A in an oxidizing ambient for about several minutes to further oxidize the insulating-film forming layer 16A and the thicker-portion forming portion 16b, whereby the insulating oxidation layer 16B having the thicker portion 16c between the gate-electrode formation region and the drain-electrode formation region is formed from the insulating-film forming layer 16A that has been oxidized.

Figure 16A:
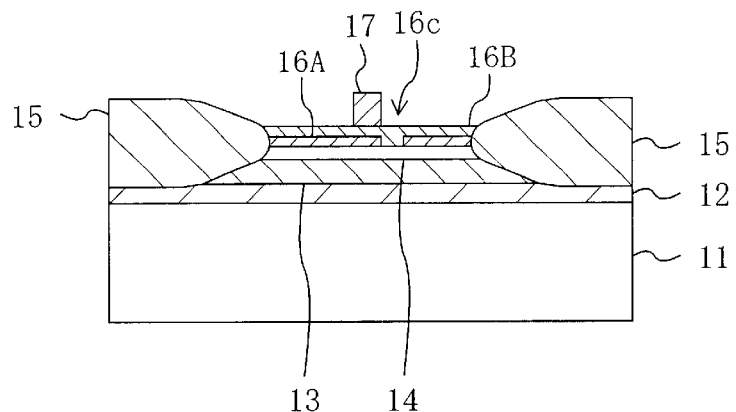
FIGS. 16A, 16B, and 16C are structural cross-sectional views illustrating the process steps of the method for fabricating the semiconductor device according to the fourth embodiment.

Next, as shown in FIG. 16A, titanium and platinum having a total film thickness of about 50 nm and gold with a film thickness of about 200 nm are stacked in layers by, e.g., sputtering. Subsequently, patterning is performed as specified with respect to the deposited gate-electrode forming film to form the gate electrode 17 therefrom.

Figure 16B:
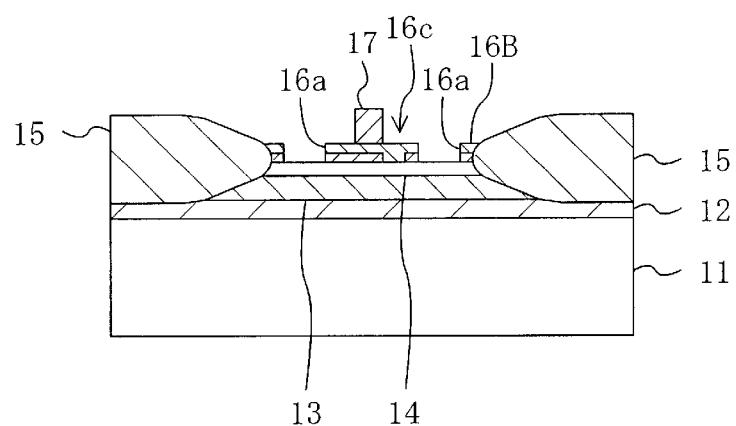

Next, as shown in FIG. 16B, selective etching is performed with respect to the regions of the insulating oxidation layer 16B which are located on both sides of the gate electrode 17 to form the openings 16a in the insulating oxidation layer 16B and thereby expose the carrier supply layer 14 through the openings 16a.

Figure 16C:
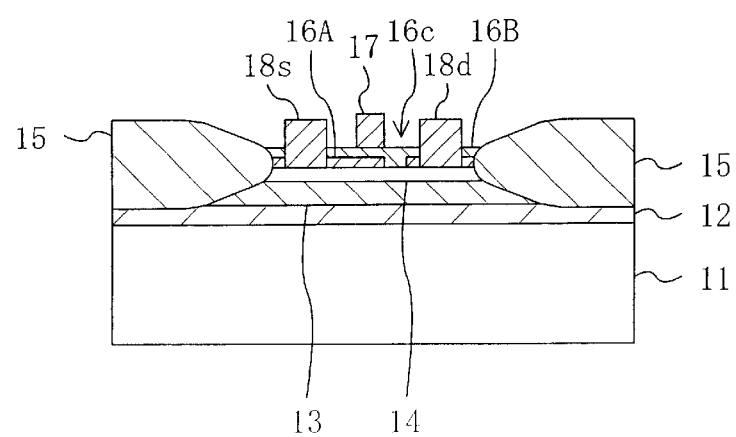

Next, as shown in FIG. 16C, titanium with a film thickness of about 20 nm and aluminum with a film thickness of about 200 nm are stacked in layers by, e.g., sputtering on the portions of the carrier supply layer 14 exposed through the openings 16a. Subsequently, patterning is performed as specified with respect to the deposited metal films by lithography and dry etching, followed by a heat treatment, whereby the source electrode 18s and the drain electrode 18d each in ohmic contact with the carrier supply layer 14 are formed from the metal films.

Thus, the fourth embodiment has provided the insulating oxidation layer 16B with the thicker portion 16c located between the gate electrode 17 and the drain electrode 18d and thereby formed the insulating oxidation layer 16B which is partially thicker. This increases the drain breakdown voltage of the HEMT and suppresses the drain leakage current, as described above.

Although the fourth embodiment has formed the thicker-portion forming portion 16b prior to the formation of the insulating oxidation layer 16B, it is also possible to otherwise form the insulating oxidation layer 16B with a substantially uniform thickness and then form the thicker portion 16c.

Although silicon has been used to compose the protective film 41, any material capable of preventing the oxidation of a nitride-based semiconductor layer may also be used instead. For example, silicon dioxide or silicon nitride may be used instead of silicon.

Embodiment 5

A method for fabricating a HEMT according to a fifth embodiment of the present invention will be described with reference to the drawings.

FIGS. 17A, 17B, and 17C and FIGS. 18A and 18B show the cross-sectional structures of the insulating-gate HEMT according to the fifth embodiment in the individual process steps of a fabrication method therefor.

Figure 17A:
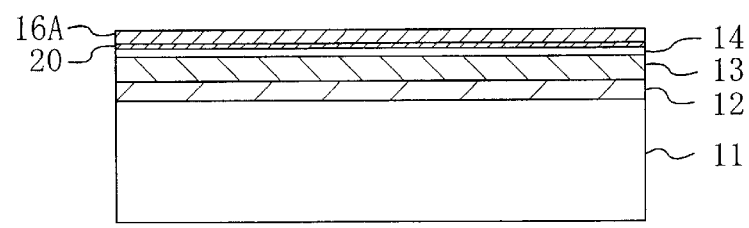
FIGS. 17A, 17B, and 17C are structural cross-sectional views illustrating the process steps of a method for fabricating a semiconductor device according to a fifth embodiment of the present invention.

First, as shown in FIG. 17A, a buffer layer 12 composed of aluminum nitride with a film thickness of, e.g., about 100 nm, a channel layer 13 composed of gallium nitride with a film thickness of about 10 nm, a carrier supply layer 14 composed of n-type aluminum gallium nitride with a film thickness of about 15 nm for doping silicon, an anti-oxidation layer 20 composed of aluminum nitride with a film thickness of about 20 nm to 50 nm, and an insulating-film forming layer 16A composed of gallium nitride with a film thickness of about 50 nm to 100 nm are grown successively by MOCVD on a substrate 11 composed of silicon carbide, whereby an epitaxial multilayer structure composed of nitride semiconductors is formed.

Figure 17B:
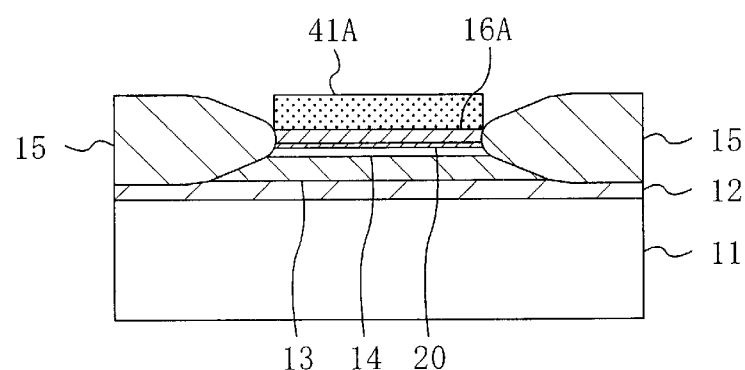

Next, as shown in FIG. 17B, a protective film 41A composed of silicon for masking the isolation formation region is formed by lithography and etching. Subsequently, a thermal oxidation process is performed with respect to the substrate 11 in an oxidizing ambient for about 1 to 2 hours, thereby selectively forming an isolation film 15 in the epitaxial multilayer structure.

Figure 17C:
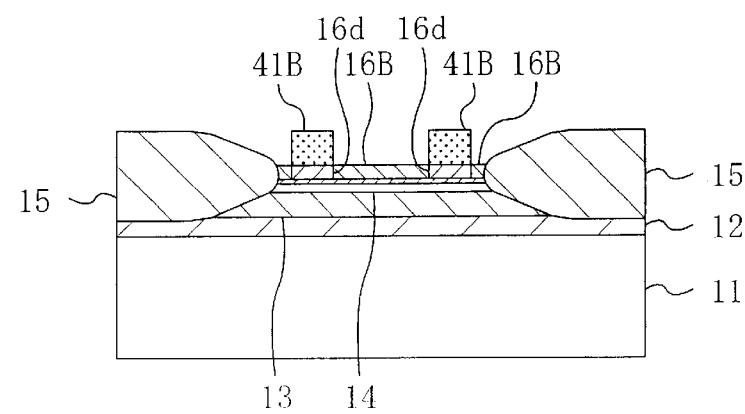

Next, as shown in FIG. 17C, an anti-oxidation protective film 41B for masking the ohmic-electrode formation regions of the insulating-film forming layer 16A are formed by lithography and etching from the protective film 41A. Subsequently, a thermal oxidation process is performed with respect to the insulating-film forming layer 16A in an oxidizing ambient for about several minutes by using the formed anti-oxidation protective film 41B as a mask, thereby forming, from the insulating-film forming layer 16A, the insulating oxidation layer 16B having conductive regions 16d in the ohmic-electrode formation regions of the insulating-film forming layer 16A.

In the fifth embodiment also, the film thickness of the insulating oxidation layer 16B is adjusted by controlling a heating time for the insulating-film forming layer 16A. The provision of the anti-oxidation layer 20 under the insulating-film forming layer 16A allows the film thickness of the insulating oxidation layer 16B to be adjusted substantially by controlling the film thickness of the insulating-film forming layer 16A, similarly to the second embodiment. This significantly improves controllability over the film thickness of the insulating oxidation layer 16B which greatly affects the operating characteristic of the device having the insulating gate.

Figure 18A:
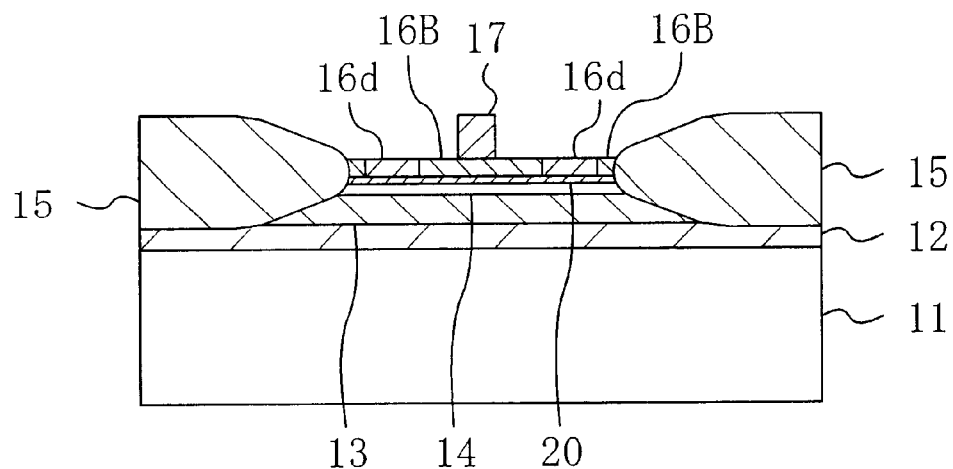
FIGS. 18A and 18B are structural cross-sectional views illustrating the process steps of the method for fabricating the semiconductor device according to the fifth embodiment.

Next, as shown in FIG. 18A, the anti-oxidation protective film 41B is removed. Then, titanium and platinum having a total film thickness of about 50 nm and gold with a film thickness of about 200 nm are stacked in layers. Subsequently, patterning is performed as specified with respect to the deposited gate-electrode forming film to form the gate electrode 17 therefrom.

Figure 18B:
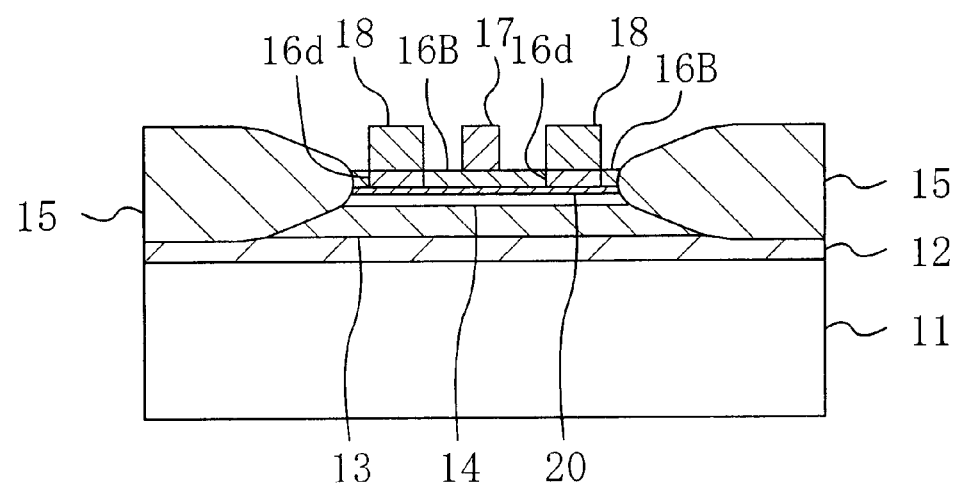
Figure 19:
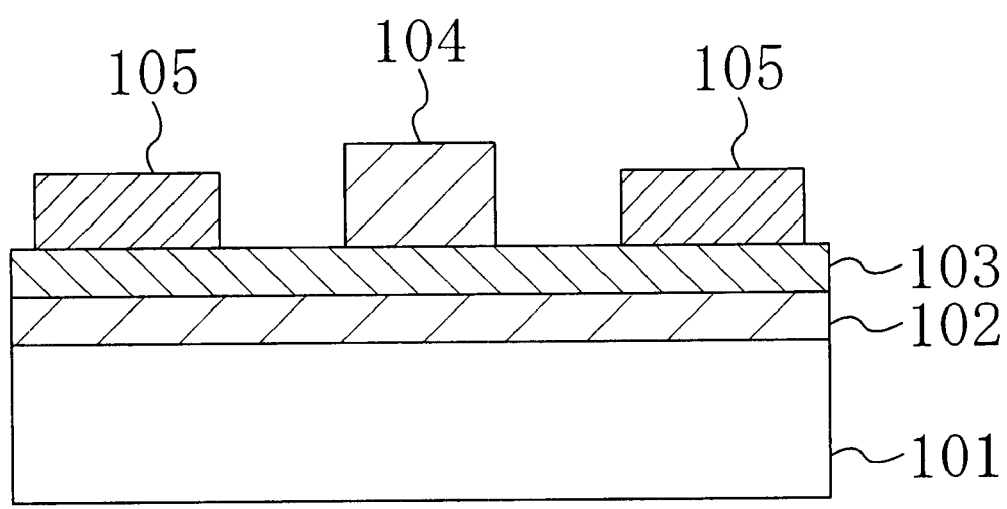
FIG. 19 is a structural cross-sectional view of a conventional HEMT having a Schottky gate.

Next, as shown in FIG. 18B, titanium with a film thickness of about 20 nm and aluminum with a film thickness of about 200 nm are stacked in layers by, e.g., sputtering over the insulating oxidation layer 16B and the conductive regions 16d. Subsequently, patterning is performed as specified with respect to the deposited metal films by lithography and dry etching, followed by a heat treatment, whereby source and drain electrodes 18 each in ohmic contact with the conductive regions 16d are formed from the metal films.

Thus, in forming the insulating oxidation layer 16B from the insulating-film forming layer 16A by thermal oxidation, the method for fabricating the HEMT according to the fifth embodiment forms the insulating oxidation layer 16B with the ohmic-electrode formation regions of the insulating-film forming layer 16A masked with the anti-oxidation protective film 41B. This prevents the ohmic-electrode formation regions of the insulating-film forming layer 16A from being oxidized and therefore the ohmic-electrode formation regions remain as the conductive regions 16d retaining an excellent electric property so that the source and drain electrodes 18 are formed as excellent ohmic electrodes each having a low contact resistance.

Although the fifth embodiment has used silicon to compose the protective film 41A, any material capable of preventing the oxidation of a nitride-based semiconductor layer may also be used instead. For example, silicon dioxide or silicon nitride may be used.

Although the fifth embodiment has formed the anti-oxidation protective film 41B for masking the conductive regions 16d of the insulating-film forming layer 16A from the protective film 41A for forming the isolation film 15, a method for forming the anti-oxidation protective film 41B is not limited thereto. Specifically, the anti-oxidation protective film 41B may be formed from another member in the step shown in FIG. 17C. If the isolation film 15 is formed by using a mesa isolation process which removes the isolation by etching instead of forming the isolation film 15 by oxidizing the epitaxial multilayer structure, it is necessary to newly form the anti-oxidation protective film 41B.

Although each of the first to fifth embodiments has used gallium nitride (GaN) to compose the insulating oxidation layer 16B, a material composing the insulating oxidation layer 16B is not limited thereto. A so-called gallium-nitride-based semiconductor such as aluminum gallium nitride, indium gallium nitride (InGaN), or indium aluminum gallium nitride (InAlGaN) may also be used instead provided that an excellent oxidation layer can be formed.

Although the insulating oxidation layer 16B has been formed by thermally oxidizing the insulating-film forming layer 16A, any method can be used provided that it allows the formation of a satisfactory oxidation film with an excellent insulating property. For example, the insulating oxidation layer 16B may also be formed by performing ion implantation, plasma doping, or the like with respect to the insulating-film forming layer 16A.

Although each of the foregoing embodiments except for the fourth embodiment has formed the insulating oxidation layer 16B by oxidizing the whole insulating-film forming layer 16A, it is also possible to oxidize only the upper portion of the insulating-film forming layer 16A and leave gallium nitride thereunder. Although the fourth embodiment has performed oxidation such that the thicker portion 16c of the insulating oxidation layer 16B reaches the lower portion of the insulating-film forming layer 16A, it is also possible to leave gallium nitride thereunder.

Although the insulating-film forming layer 16A composed of gallium nitride has been formed on the carrier supply layer 14 composed of aluminum gallium nitride, it is also possible to increase the film thickness of the carrier supply layer 14, selectively oxidize only the upper portion thereof, and form the insulating oxidation layer 16B from the carrier supply layer 14.

Although the HEMT using gallium nitride to compose the channel layer 13 and using n-type aluminum gallium nitride to compose the carrier supply layer 14 has been adopted as the semiconductor device having the insulating gate, it is also possible to adopt a HEMT or FET using, e.g., gallium nitride, aluminum gallium nitride, indium gallium nitride, indium aluminum gallium nitride, or the like instead. In the case of adopting the HEMT, however, a material having an energy gap larger than that of the channel layer 13 is used normally to compose the carrier supply layer 14. As is well known, a gallium-nitride-based semiconductor containing aluminum (Al) as a component has a larger semiconductor energy gap, while a gallium-nitride-based semiconductor containing indium (In) as a component has a smaller semiconductor energy gap.

Although silicon carbide has been used to compose the substrate 11, any substrate may be used provided that it is composed of gallium nitride, sapphire ($Al_2O_3$), or the like instead of silicon carbide and the channel layer 13 composed of Group III–V nitride semiconductors or the like can be grown epitaxially thereon.

Materials composing the gate electrode 17 and the source and drain electrodes 18 are not limited to the metals mentioned above.

The order in which the gate electrode 17 and the source and drain electrodes 18 are formed is not fixed. Either one of the gate electrode 17 and the source and drain electrodes 18 may be formed prior to the formation of the other.

Although the isolation film 15 has been formed by selectively oxidizing the epitaxial multilayer structure composed of nitride semiconductors, it may also be formed by a mesa isolation process which removes the isolation portion by etching.

The source and drain electrodes 18 may also be formed by a so-called lift-off process which forms a mask pattern having openings corresponding to the source and drain formation regions, deposits a metal film on the mask pattern such that the openings are filled therewith, and then removes the resist pattern, instead of patterning the deposited metal film.

What is claimed is:

1. A method for fabricating a semiconductor device, the method comprising:
    a first step of forming a first nitride semiconductor layer over a substrate;

a second step of forming a second nitride semiconductor layer on the first nitride semiconductor layer and oxidizing the formed second nitride semiconductor layer to form an insulating oxidation layer composed of the second nitride semiconductor layer;

a third step of forming a gate electrode on the insulating oxidation layer; and a fourth step of performing selective etching with respect to regions of the insulating oxidation layer which are located on both sides of the gate electrode to form openings in the insulating oxidation layer and forming source and drain electrodes in the formed openings.

2. The method of claim 1, wherein an oxidation rate for the first nitride semiconductor layer is lower than an oxidation rate for the second nitride semiconductor layer.

3. The method of claim 1, wherein each of the first and second nitride semiconductor layers is composed of the same material.

4. The method of claim 1, further comprising, prior to the first step, the step of:

forming, on the substrate, an active layer composed of a third nitride semiconductor having an energy gap smaller than in the first nitride semiconductor layer.

5. The method of claim 1, further comprising, between the first and second steps, the step of:

forming, on the first nitride semiconductor layer, an anti-oxidation layer composed of a fourth nitride semiconductor having an oxidation rate lower than an oxidation rate for the second nitride semiconductor layer.

6. The method of claim 5, wherein the anti-oxidation layer contains aluminum.

7. The method of claim 1, further comprising, between the second and third steps, the step of:

forming an insulating film on the insulating oxidation layer, wherein the fourth step includes the step of:

forming openings also in regions of the insulating film to be formed with the source and drain electrodes.

8. The method of claim 7, wherein the insulating film is composed of a silicon oxide film or a silicon nitride film.

9. The method of claim 1, wherein the second step includes the steps of:

forming the insulating oxidation layer on at least a region of the second nitride semiconductor layer to be formed with the gate electrode; and selectively oxidizing a region between the gate-electrode formation region and a region to be formed with the drain electrode to form the insulating oxidation layer with a thicker portion which is larger in thickness than the insulating oxidation layer.

10. The method of claim 1, wherein the first nitride semiconductor layer contains aluminum.

11. A method for fabricating a semiconductor device, the method comprising:

a first step of forming a first nitride semiconductor layer over a substrate;

a second step of forming a second nitride semiconductor layer on the first nitride semiconductor layer;

a third step of forming an anti-oxidation protective film on regions of the second nitride semiconductor layer to be formed with ohmic electrodes;

a fourth step of oxidizing the second nitride semiconductor layer by using the anti-oxidation protective film as a mask to form an insulating oxidation layer in the second nitride semiconductor layer except for the ohmic-electrode formation regions;

a fifth step of removing the anti-oxidation protective film and forming the ohmic electrodes on the ohmic-electrode formation regions of the second nitride semiconductor layer; and selectively forming a gate electrode on the insulating oxidation layer.

12. The method of claim 11, wherein the anti-oxidation protective film is composed of silicon.

13. The method of claim 11, wherein the anti-oxidation protective film is an insulating film.

14. The method of claim 11, further comprising, between the second and third steps, the steps of:

forming, on the second nitride semiconductor layer, a protective film covering a region of the second nitride semiconductor layer to be formed with a device; and oxidizing the first and second nitride semiconductor layers by using the formed protective film as a mask to form an isolation film in a peripheral portion of the device formation region, wherein the third step includes the step of:

forming the anti-oxidation protective film from the protective film.

15. The method of claim 11, further comprising, prior to the first step, the step of:

forming, on the substrate, an active layer composed of a third nitride semiconductor having an energy gap smaller than in the first nitride semiconductor layer.

16. The method of claim 11, further comprising, between the first and second steps, the step of:

forming, on the first nitride semiconductor layer, an anti-oxidation layer composed of a fourth nitride semiconductor having an oxidation rate lower than an oxidation rate for the second nitride semiconductor layer.

17. The method of claim 16, wherein the anti-oxidation layer contains aluminum.

18. The method of claim 11, wherein the first nitride semiconductor layer contains aluminum.

* * * * *